United States Patent
Kim et al.

(10) Patent No.: US 8,531,906 B2
(45) Date of Patent: Sep. 10, 2013

(54) SEMICONDUCTOR MEMORY DEVICE AND METHOD FOR OPERATING THE SAME

(71) Applicant: SK hynix Inc., Gyeonggi-do (KR)

(72) Inventors: Kwi-Dong Kim, Gyeonggi-do (KR);
Mun-Phil Park, Gyeonggi-do (KR);
Sung-Ho Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/755,584

(22) Filed: Jan. 31, 2013

(65) Prior Publication Data

US 2013/0148449 A1    Jun. 13, 2013

Related U.S. Application Data

(62) Division of application No. 12/614,867, filed on Nov. 9, 2009, now Pat. No. 8,379,473.

(30) Foreign Application Priority Data

Jul. 1, 2009    (KR) .................. 10-2009-0059850

(51) Int. Cl.
*G11C 8/00*    (2006.01)

(52) U.S. Cl.
USPC ................................ 365/230.03; 365/230.06

(58) Field of Classification Search
USPC ....................................... 365/230.06, 230.03
See application file for complete search history.

(56) References Cited

U.S. PATENT DOCUMENTS

2006/0215478 A1* 9/2006 Shibata et al. ........... 365/230.03

* cited by examiner

*Primary Examiner* — Jason Lappas
(74) *Attorney, Agent, or Firm* — IP & T Group LLP

(57) ABSTRACT

A semiconductor memory device includes first and second write driving blocks to perform a data write operation on first and second memory banks in response to first and second bank strobe signals, respectively, and a common input driving block to transmit data to the first and second write driving blocks through a common data line in response to access information of the first and second memory banks.

10 Claims, 4 Drawing Sheets

SEMICONDUCTOR MEMORY DEVICE AND METHOD FOR OPERATING THE SAME

CROSS-REFERENCE TO RELATED APPLICATION

This application is a division of U.S. patent application Ser. No. 12/614,867 filed on Nov. 9, 2009, which claims priority of Korean Patent Application No. 10-2009-0059850 filed on Jul. 1, 2009. The disclosure of the foregoing application is incorporated herein by reference in its entirety.

BACKGROUND OF THE INVENTION

Exemplary embodiments of the present invention relate to semiconductor design technology, and more particularly, to a semiconductor memory device for performing a data write operation on a memory bank using an input driver and a write driver.

In general, as the processing technology of a semiconductor memory device such as a double data rate synchronous dynamic random access memory device (DDR SDRAM) is highly developed, the number of memory banks employed in the semiconductor memory device is gradually increasing. Thus, the design technology of the semiconductor memory device is being diversified to effectively input/output a plurality of data stored in the memory banks. Among different types of the technology, there is a scheme of disposing the plurality of memory banks with a stack structure, and a data width option for establishing an interface between a controller and the semiconductor memory device as x4, x8, or x16.

For reference, the data width option enhances the variety of the interface of the semiconductor memory device and refers to an option capable of establishing a data width between the controller and the semiconductor memory device. For instance, in a semiconductor memory device employing 16 numbers of input/output pads, it is possible to establish the data width option as x16 or x8. In the case of establishing the data width option as x16, the semiconductor memory device performs a data transmission operation through the 16 numbers of input/output pads. Meanwhile, in the case of establishing the data width option as x8, the semiconductor memory device performs the data transmission operation through 8 numbers of input/output pads among the 16 numbers of input/output pads.

FIG. 1 illustrates a block diagram of a part of a conventional semiconductor memory device. For instance, the conventional semiconductor memory device employs 16 numbers of input/output pads (not shown) and has a structure capable of accomplishing the x8 or x16 data width option.

FIG. 1 shows first and second memory banks 110_1 and 130_2 each of which includes first and second sub-memory banks. That is, the first memory bank 110_1 includes first and second sub-memory banks 110_1L and 110_1R and the second memory bank 130_2 includes first and second sub-memory banks 130_2L and 130_2R. In the first and second sub-memory banks 110_1L, 110_1R, 130_2L, and 130_2R corresponding to the first and second memory banks 110_1 and 130_2, respectively, a write operation is performed by their corresponding write driving blocks and input driving blocks.

Namely, in the first sub-memory bank 110_1L corresponding to the first memory bank 110_1 the write operation is performed by a write driving block 150_1L and an input driving block 170_1L. In the second sub-memory bank 110_1R corresponding to the first memory bank 110_1, the write operation is performed by a write driving block 150_1R and an input driving block 170_1R. In the first sub-memory bank 130_2L corresponding to the second memory bank 130_2, the write operation is performed by a write driving block 150_2L and an input driving block 170_2L. In the second sub-memory bank 130_2R corresponding to the second memory bank 130_2, the write operation is performed by a write driving block 150_2R and an input driving block 170_2R.

The input driving blocks 170_1L, 170_2L, 170_1R, and 170_2R are respectively under the control of input control signals CTR_1L, CTR_2L, CTR_1R, and CTR_2R, and transmit data transferred through corresponding global input/output lines GIO_U and GIO_D to the write driving blocks 150_1L, 150_2L, 150_1R, and 150_2R, respectively. Herein, the global input/output lines GIO_U and GIO_D may be divided into the up global input/output line GIO_U and the down global input/output line GIO_D. Each of the up and down global input/output lines GIO_U and GIO_D corresponds to 8 input/output pads (not shown). The input driving blocks 170_1L, 170_2L, 170_1R, and 170_2R respectively receive the data transferred through the up global input/output line GIO_U and the down global input/output line GIO_D in response to the input control signals CTR_1L, CTR_1R, and CTR_2R whose logic levels are determined according to the data width option. That is, the input control signals CTR_1L, CTR_2L, CTR_1R, and CTR_2R control the data transmitted through the up global input/output line GIO_U and the down global input/output line GIO_D to be inputted to the corresponding input driving blocks 170_1L, 170_2L, 170_1R, and 170_2R, respectively.

In the meantime, data outputted through each of the input driving blocks 170_1L, 170_2L, 170_1R, and 170_2R are inputted to a corresponding one of the write driving blocks 150_1L, 150_2L, 150_1R, and 150_2R. The write driving blocks 150_1L, 150_2L, 150_1R, and 150_2R perform a write operation on the first and second memory banks 110_1 and 130_2 for the data outputted from the input driving blocks 170_1L, 170_2L, 170_1R, and 170_2R in response to corresponding write activation signals BWEN_1L, BWEN_2L, BWEN_1R, and BWEN_2R, respectively.

FIG. 2 illustrates an activation signal generating block for generating the write activation signals BWEN_1L, BWEN_1R, BWEN_2L, and BWEN_2R described in FIG. 1.

Referring to FIG. 2, the activation signal generating block includes a logic combining sector 210 and a delay sector 230.

The logic combining sector 210 logically combines first and second bank strobe signals STB_BK1 and STB_BK2 and the input control signals CTR_1R, CTR_1L, CTR_2R, and CTR_2L. The delay sector 230 outputs the write activation signals BWEN_1R, BWEN_1L, BWEN_2R, and BWEN_2L by reflecting delay times corresponding to output signals of the logic combining sector 210. Herein, the first and second bank strobe signals STB_BK1 and STB_BK2 have information for a memory bank where access is performed of the first and second memory banks 110_1 and 130_2 described in FIG. 1. Therefore, the write activation signals BWEN_1R, BWEN_1L, BWEN_2R, and BWEN_2L, generated by logically combining the input control signals CTR_1R, CTR_1L, CTR_2R, and CTR_2L and the first and second bank strobe signals STB_BK1 and STB_BK2, have information for a memory bank where access is performed of the first and second memory banks 110_1 and 130_2, and information for the first and second sub-memory banks where the data write operation is performed.

FIG. 3 illustrates a timing diagram for explaining a circuit operation of the semiconductor memory device described in FIG. 1. Where the data width option is established as x8, the data are transmitted through the up global input/output line GIO_U and the transmitted data may be written in one of the first and second sub-memory banks 110_1L, 110_1R, 130_2L, and 130_2R of the first and second memory banks 110_1 and 130_2 according to a control scheme. For the simplicity of explanation, the following describes only the write operation in which the data transmitted through the up global input/output line GIO_U are written in the second sub-memory bank 110_1R of the first memory bank 110_1 in response to a first write command WT1, and the data transmitted through the up global input/output line GIO_U are written in the first sub-memory bank 130_2L of the second memory bank 130_2 in response to a second write command WT2.

Referring to FIGS. 1 to 3, in a state where the data width option is established as x8, the input control signals CTR_1R and CTR_2L have a logic high level to write the data transmitted through the up global input/output line GIO_U in the second sub-memory bank 110_1R of the first memory bank 110_1 and the first sub-memory bank 130_2L of the second memory bank 130_2, respectively.

First, if the first write command WT1 is inputted, the first bank strobe signal STB_BK1 corresponding to the first memory bank 110_1 is enabled and the data transmitted through the up global input/output line GIO_U are transferred to the write driving blocks 150_2L and 150_1R through the input driving blocks 170_2L and 170_1R, respectively. At this time, since only the write activation signal BWEN_1R is enabled, only the write driving block 150_1R is activated, and the data are written in the second sub-memory bank 110_1R of the first memory bank 110_1.

Then, if the second write command WT2 is inputted, the second bank strobe signal STB_BK2 corresponding to the second memory bank 130_2 is enabled and the data transmitted through the up global input/output line GIO_U are transferred to the write driving block 150_2L through the input driving block 170_2L, and written in the first sub-memory bank 130_2L of the second memory bank 130_2.

In the above description, the input control signals CTR_1L and CTR_2R have a logic low level, so as to reduce unnecessary power consumption during the write operation performed by the first and second write commands WT1 and WT2.

For reference, signals for controlling the data width option (not shown) are additionally inputted to the input driving blocks 170_1L, 170_2L, 170_1R, and 170_2R, and therefore, it is possible to perform a x16 data width option operation.

The conventional semiconductor memory device includes the input driving blocks 170_1L, 170_2L, 170_1R, and 170_2R to perform the data width option operation. Besides, it is required to include data lines to transmit the data outputted from the input driving blocks 170_1L, 170_2L, 170_1R and 170_2R and control signal lines to transmit the input control signals CTR_1L, CTR_2L, CTR_1R, and CTR_2R for controlling the input driving blocks 170_1L, 170_2L, 170_1R, and 170_2R, respectively.

Recently, since the number of memory banks included in the semiconductor memory device is on an increasing trend, the semiconductor memory device adopts the stack structure as described in FIG. 1. As a result, the number of the input driving blocks 170_1L, 170_2L, 170_1R, and 170_2R further increases, and thus, the number of input/output data lines and the number of control signal lines corresponding to the input driving blocks 170_1L, 170_2L, 170_1R, and 170_2R also increase. The increase of the number of the input driving blocks 170_1L, 170_2L, 170_1R, and 170_2R causes the increase of an area occupied by the input driving blocks.

Moreover, because output data lines of input driving blocks 170_1L, 170_2L, 170_1R, and 170_2R are disposed to cross the memory banks, where the number of the output data lines increases, the increase acts as a big burden in designing the memory banks. Further, in case the number of the control signal lines corresponding to the input driving blocks 170_1L, 170_2L, 170_1R, and 170_2R also increases, the increased number also acts as a big burden in the circuit design.

Next, consider that the up global input/output line GIO_U is connected to the input driving blocks 170_1L, 170_2L, 170_1R, and 170_2R. Therefore, an increase in the number of input driving blocks may cause a problem in that a large load is put on the up global input/output line GIO_U.

SUMMARY OF THE INVENTION

An embodiment of the present invention is directed to a semiconductor memory device capable of minimizing the number of control signal lines and the number of input/output data lines connected to a common input driver by employing the common input driver corresponding to a plurality of memory banks.

Another embodiment of the present invention is directed to a semiconductor memory device, including an input driver capable of performing a more active operation, by reflecting access information of a memory bank on a signal for controlling the input driver.

In accordance with an embodiment of the present invention, a semiconductor memory device includes first and second write driving blocks to perform a data write operation on first and second memory banks in response to first and second bank strobe signals, respectively, and a common input driving block to transmit data to the first and second write driving blocks through a common data fine in response to access information of the first and second memory banks.

In accordance with another embodiment of the present invention, a semiconductor memory device includes first and second memory banks each of which includes a plurality of sub-memory banks corresponding to data width option information, a plurality of write driving blocks each of which performs a data write operation on each of the sub-memory banks in response to a first or second bank strobe signal, a control signal generating block to generate a plurality of input control signals by reflecting access information of the first and second memory banks on a multiplicity of control signals corresponding to the data width option information and a plurality of common input driving blocks each of which transmits data through a common data line to a write driving block, among the plurality of write driving blocks, for each of the first and second memory banks, wherein the plurality of common input driving blocks are activated in response to the plurality of input control signals.

In accordance with yet another embodiment of the present invention, a semiconductor memory device includes generating a plurality of bank strobe signals corresponding to a plurality of memory banks in response to write commands, wherein each of the memory banks includes sub-memory banks whose number corresponds to data width option information, generating a plurality of input control signals by reflecting the plurality of bank strobe signals on a multiplicity of control signals corresponding to the data width option information, and receiving data during enable periods of the input control signals and performing a write operation on a corresponding sub-memory bank among the sub-memory banks in response to the bank strobe signals.

The semiconductor memory device in accordance with the embodiment of the present disclosure can minimize the number of control signal lines and the number of input/output data lines connected to the common input driver by employing the common input driver corresponding to the plurality of memory banks. Furthermore, the common input driver can perform an active operation corresponding to a memory bank where a write operation is performed, and, through this active operation, it is possible to reduce a circuit area, while performing the same write operation as the conventional write operation.

DESCRIPTION OF SPECIFIC EMBODIMENTS

Figure 1:
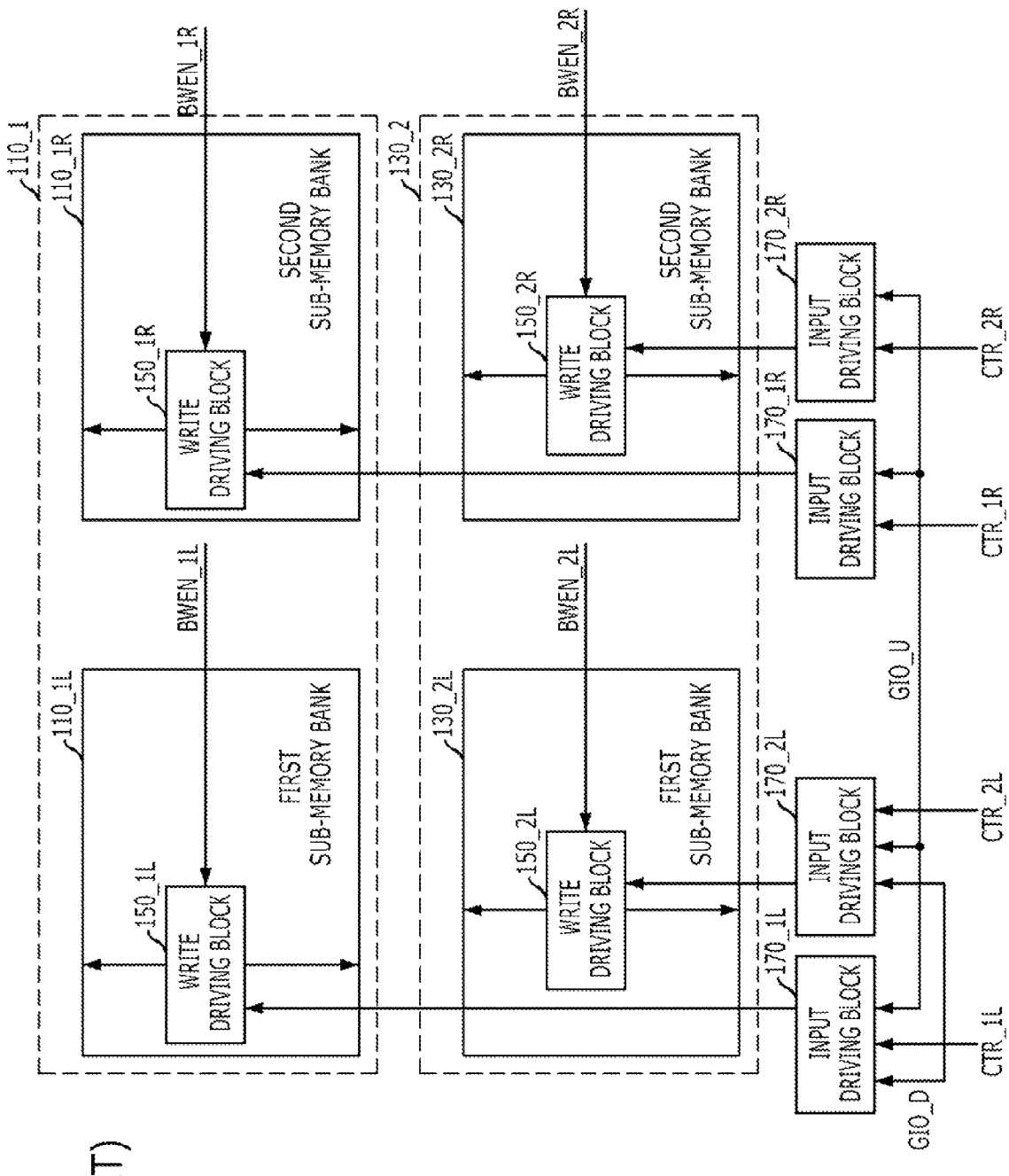
FIG. 1 illustrates a block diagram of a part of a conventional semiconductor memory device.
Figure 2:
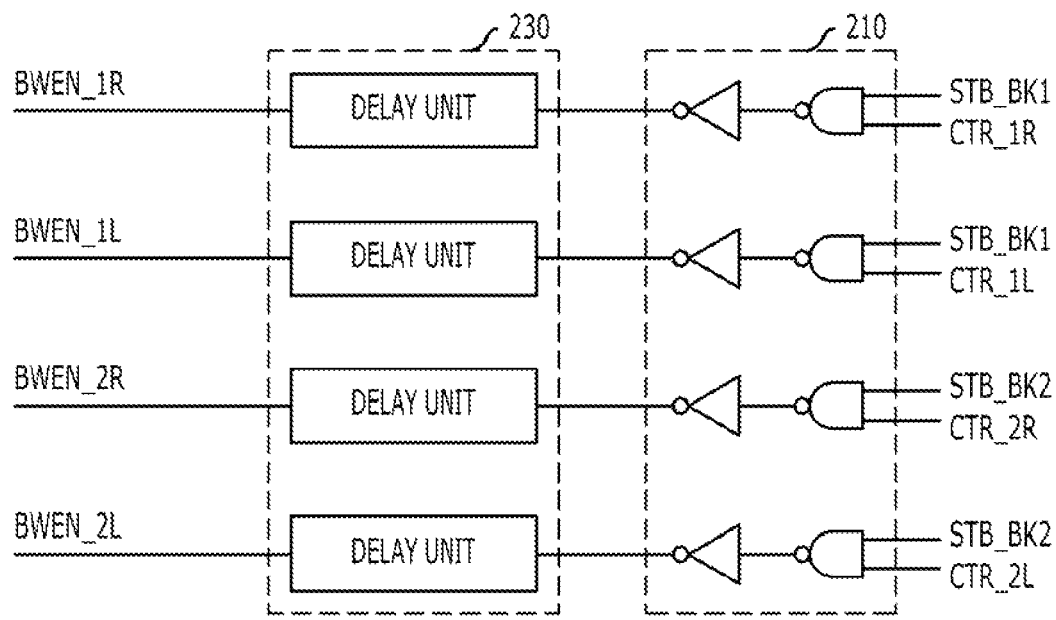
FIG. 2 illustrates an activation signal generating block for generating write activation signals BWEN_1L, BWEN_1R, BWEN_2L and BWEN_2R shown in FIG. 1.
Figure 3:
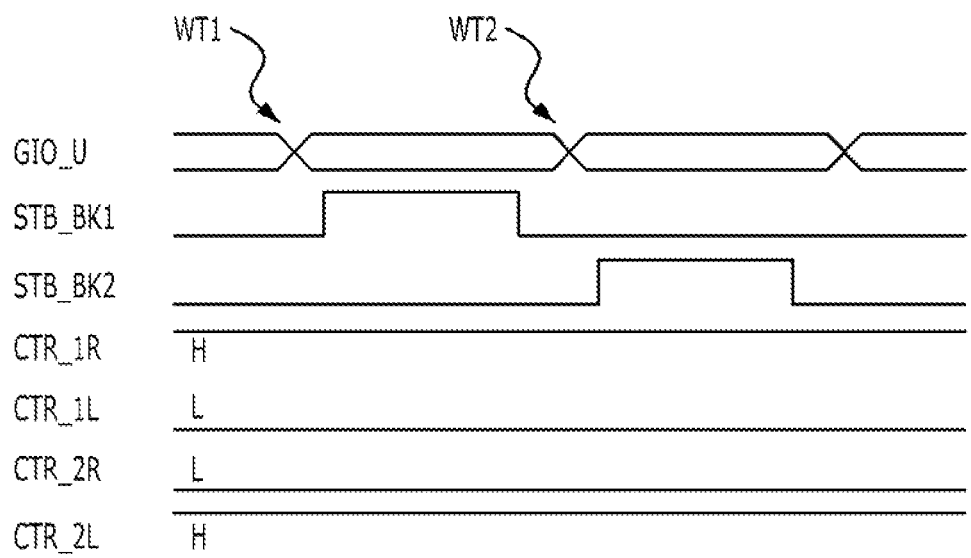
FIG. 3 illustrates a timing diagram for explaining a circuit operation of the semiconductor memory device shown in FIG. 1.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
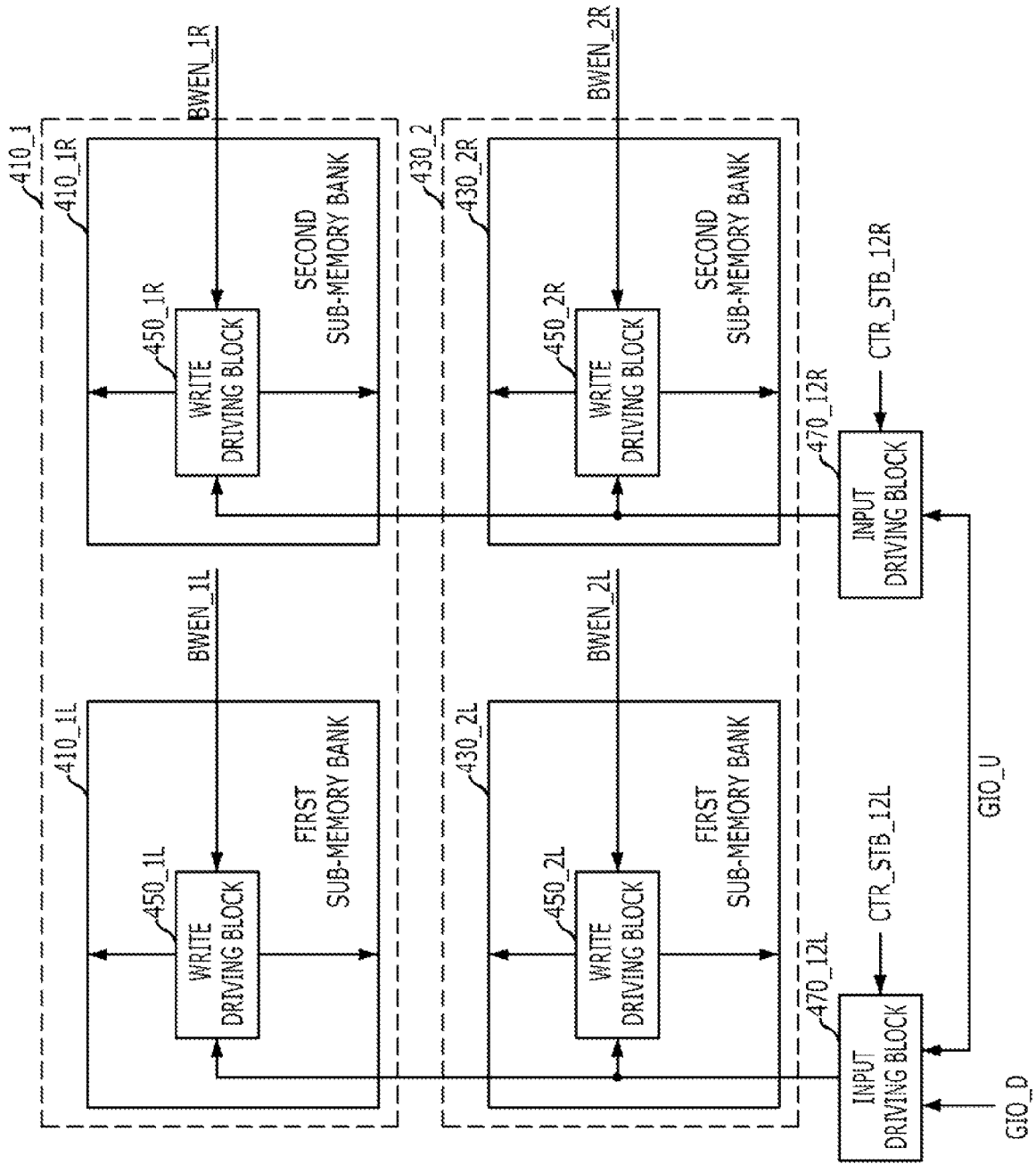
FIG. 4 illustrates a block diagram of a part of a semiconductor memory device in accordance with an embodiment of the present invention.

FIG. 4 illustrates a block diagram of a part of a semiconductor memory device in accordance with an embodiment of the present invention. For instance, the semiconductor memory device employs 16 numbers of input/output pads (not shown) and has a structure capable of accomplishing an x8 or x16 data width option.

FIG. 4 describes first and second memory banks 410_1 and 430_2 each of which includes first and second sub-memory banks. That is, the first memory bank 410_1 includes first and second sub-memory banks 410_1L and 410_1R, and the second memory bank 430_2 includes first and second sub-memory banks 430_2L and 430_2R. The first and second sub-memory banks 410_1L, 410_1R, 430_2L, and 430_2R corresponding to the first and second memory banks 410_1 and 430_2, respectively, include their corresponding write driving blocks 450_1L, 450_1R, 450_2L, and 450_2R. Herein, the number of sub-memory banks included in one memory bank is designed according to a data width option. For example, two sub-memory banks should be designed in one memory bank to perform an x8 data width option operation on the basis of the 16 input/output pads. Further, the number of the write driving blocks is also designed according to the number of sub-memory banks.

Meanwhile, in the semiconductor memory device in accordance with this embodiment, the first sub-memory banks 410_1L and 430_2L respectively included in the first and second memory banks 410_1 and 430_2 share a first input driving block 470_12L, and the second sub-memory banks 410_1R and 430_2R respectively included in the first and second memory banks 410_1 and 430_2 share a second input driving block 470_12R. When comparing this embodiment with the case in which two input driving blocks are employed in each memory bank to perform the conventional data width option operation, the number of input driving blocks is reduced to a half in this embodiment. Thus, it is possible to reduce an area occupied by the blocks. Herein, the number of input driving blocks corresponds to the number of sub-memory banks included in one memory bank. For example, this embodiment employs two input driving blocks.

Furthermore, as shown in FIG. 4, since the first and second sub-memory banks share the first and second input driving blocks 470_12L and 470_12R, it is possible to reduce the number of control signal lines and the number of input/output data lines connected to the input driving blocks 470_12L and 470_12R.

In particular, a write operation of the first sub-memory banks 410_1L and 430_2L respectively corresponding to the first and second memory banks 410_1 and 430_2 is performed by the write driving blocks 450_1L and 450_2L and the first input driving block 470_12L commonly shared by the write driving blocks 450_1L and 450_2L. A write operation of the second sub-memory banks 410_1R and 430_2R respectively corresponding to the first and second memory banks 410_1 and 430_2 is performed by the write driving blocks 450_1R and 450_2R and the second input driving block 470_12R commonly shared by the write driving blocks 450_1R and 450_2R.

The first input driving block 470_12L is controlled by a first input control signal CTR_STB_12L receives data transferred through corresponding global input/output lines GIO_U and GIO_D, and transmits the received data to the write driving blocks 450_1L and 450_2L. Herein, the global input/output lines GIO_U and GIO_D may be divided into the up global input/output line GIO_U and the down global input/output line GIO_D. Each of the up global input/output line GIO_U and the down global input/output line GIO_D corresponds to 8 input/output pads (not shown). The first input driving block 470_12L receives the data transferred through the up and down global input/output lines GIO_U and GIO_D in response to the first input control signal CTR_STB_12L corresponding to the data width option. That is, the first input control signal CTR_STB_12L plays a role of controlling the data transferred through the up and down global input/output lines GIO_U and GIO_D to be inputted to the first input driving block 470_12L.

Meanwhile, the second input driving block 470_12R is under the control of a second input control signal CTR_STB_12R, receives data transferred through the up global input/output line GIO_U, and transmits the received data to the write driving blocks 450_1R and 450_2R. That is, the second input control signal CTR_STB_12R plays a role of controlling the data transferred through the up global input/output line GIO_U to be inputted to the second input driving block 470_12R.

The first and second input control signals CTR_STB_12L and CTR_STB_12R in accordance with this embodiment control the data input of the first and second input driving blocks 470_12L and 470_12R, and recognize a memory bank where access of the first and second memory banks 410_1 and 430_2 is performed. This operation will be described in detail with reference to FIGS. 5 and 6. According to this property of the first and second input control signals CTR_STB_12L and CTR_STB_12R the first and second input driving blocks 470_12L and 470_12R are able to operate more actively.

In the meantime, data outputted through the first and second input driving blocks 470_12L and 470_12R are inputted to the corresponding write driving blocks 450_1L, 450_2L, 450_1R, and 450_2R through common output lines. Herein, the common output lines are arranged to cross the second memory bank 430_2. Each of the write driving blocks 450_1L, 450_2L, 450_1R, and 450_2R performs the write operation for the data transferred through its corresponding common output line in the first or second memory bank 410_1 or 430_2 in response to a corresponding one of write activation signals BWEN_1L, BWEN_2L, BWEN_1R, and BWEN_2R. Herein, the write activation signals BWEN_1L, BWEN_1R, BWEN_2L, and BWEN_2R may be generated through the same circuit construction as that of the conventional semiconductor memory device.

Figure 5:
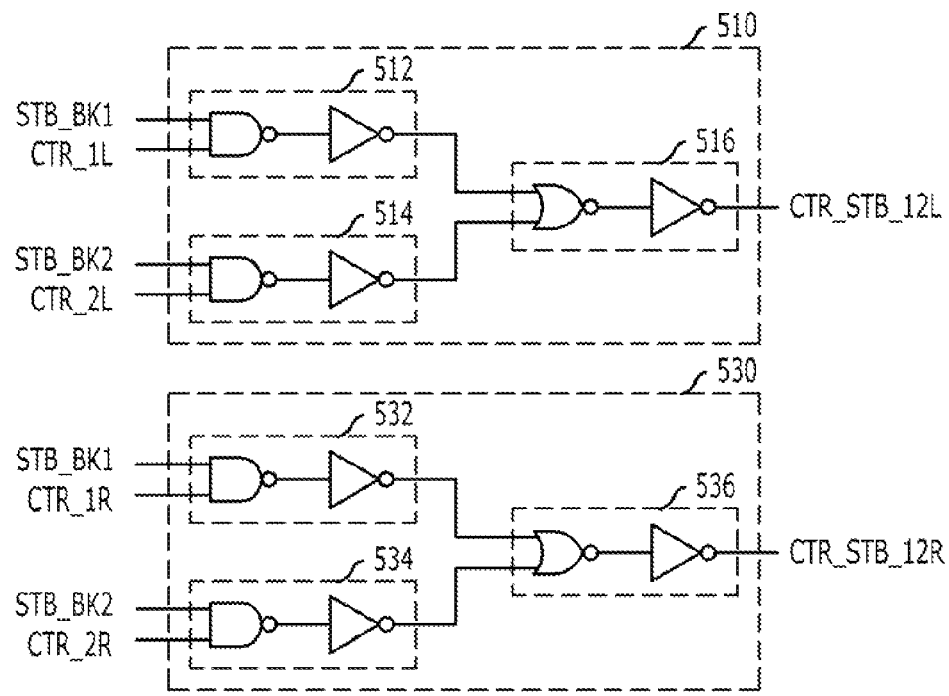
FIG. 5 illustrates a circuit diagram of a control signal generating block for generating first and second input control signals CTR_STB_12L and CTR_STB_12R, respectively, shown in FIG. 4.

FIG. 5 illustrates a circuit diagram of a control signal generating block for generating the first and second input control signals CTR_STB_12L and CTR_STB_12R shown in FIG. 4.

Referring to FIG. 5, the control signal generating block includes a first control signal generating sector 510 and a second control signal generating sector 530.

The first control signal generating sector 510 produces the first input control signal CTR_STB_12L by reflecting information for the memory bank where the access is performed on control signals CTR_1L and CTR_2L having predetermined logic levels according to the data width option. Herein, the accessed memory bank means a memory bank where the write operation is performed and the information for the accessed memory bank is obtained from first and second bank strobe signals STB_BK1 and STB_BK2.

Herein, the first control signal generating sector 510 includes first and second signal combining units 512 and 514 and a first output unit 516. The first signal combining unit 512 receives the first bank strobe signal STB_BK1 and the control signal CTR_1L and logically combines the received signals, and the second signal combining unit 514 receives the second bank strobe signal STB_BK2 and the control signal CTR_2L and logically combines the received signals. Thus, the first output unit 516 generates the first input control signal CTR_STB_12L in response to output signals of the first and second signal combining units 512 and 514.

The second control signal generating sector 530 produces the second input control signal CTR_STB_12R by reflecting the first and second bank strobe signals STB_BK1 and STB_BK2 on the control signals CTR_1R and CTR_2R having the predetermined logic levels according to the data width option.

Herein, the second control signal generating sector 530 includes third and fourth signal combining units 532 and 534 and a second output unit 536. The third signal combining unit 532 receives the first bank strobe signal STB_BK1 and the control signal CTR_1R and logically combines the received signals and the fourth signal combining unit 534 receives the second bank strobe signal STB_BK2 and the control signal CTR_2R and logically combines the received signals. Thus, the second output unit 536 generates the second input control signal CTR_STB_12R in response to output signals of the third and fourth signal combining units 532 and 534.

The first and second input control signals CTR_STB_12L and CTR_STB_12R produced according to this embodiment have the information for the memory bank where access of the first and second memory banks 410_1 and 430_2 is performed, so that it is possible to control the data input of the first and second input driving blocks 470_12L and 470_12R.

Figure 6:
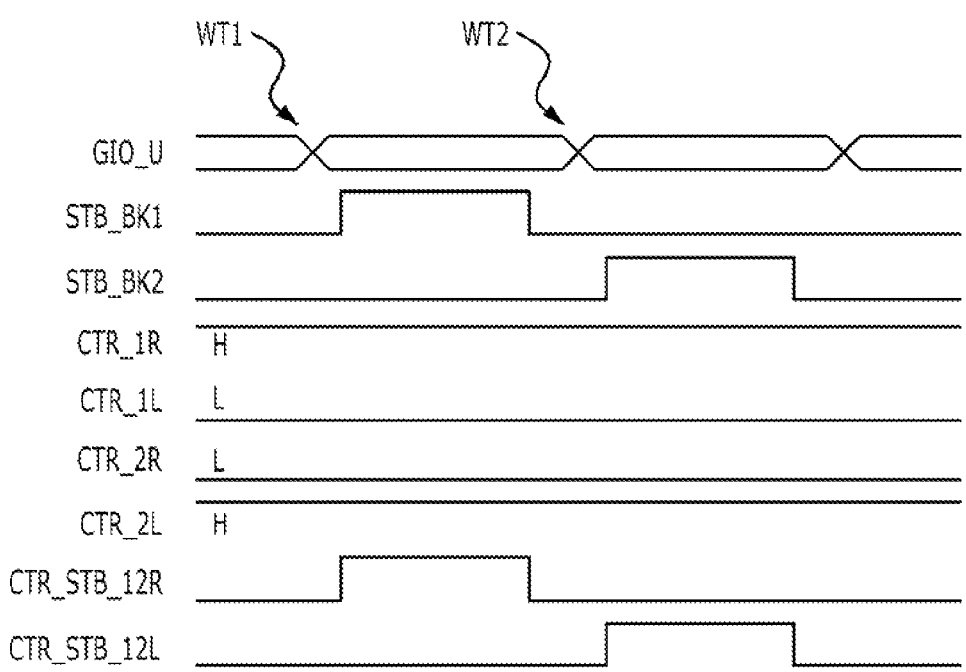
FIG. 6 illustrates a timing diagram for explaining a circuit operation of the semiconductor memory device shown in FIG. 4.

FIG. 6 illustrates a timing diagram for explaining a circuit operation of the semiconductor memory device shown in FIG. 4. Where the data width option is established as x8, the data are transferred through the up global input/output line GIO_U and the transferred data may be written in one of the first and second sub-memory banks 410_1L, 410_1R, 430_2L and 430_2R of the first and second memory banks 410_1 and 430_1 according to a control scheme. For the simplicity of explanation, it is assumed that the data transferred through the up global input/output line GIO_U are written in the second sub-memory bank 410_1R of the first memory bank 410_1 by a first write command WT1, and the data transferred through the up global input/output line GIO_U are written in the first sub-memory bank 430_2L of the second memory bank 430_2 by a second write command WT2.

Referring to FIGS. 4 to 6, in a state where the data width option is established as x8, the control signals CTR_1R and CTR_2L have a logic high level and the control signals CTR_1L and CTR_2R have a logic low level to write the data inputted through the up global input/output line GIO_U in the second sub-memory bank 410_1R of the first memory bank 410_1 and the first sub-memory bank 430_2L of the second memory bank 430_2.

First, if the first write command WT1 is inputted, the first bank strobe signal STB_BK1 corresponding to the first memory bank 410_1 is enabled. Therefore, the third signal combining unit 532 outputs a signal that is enabled by the first bank strobe signal STB_BK1 and the control signal CTR_1R, so that the second input control signal CTR_STB_12R is enabled. As a result, the second input driving block 470_12R receives the data inputted through the up global input/output line GIO_U and transmits the received data to the write driving blocks 450_1R and 450_2R respectively corresponding to the first and second memory banks 410_1 and 430_2. At this time, the write driving block 450_1R is activated in response to the write activation signal BWEN_1R, and data outputted from the second input driving block 470_12R are written in the second sub-memory bank 410_1R of the first memory bank 410_1. Then, the second input control signal CTR_STB_12R is disabled in response to the first bank strobe signal STB_BK1, and the data transferred through the up global input/output line GIO_U are not inputted to the second input driving block 470_12R anymore.

Subsequently, if the second write command WT2 is inputted, the second bank strobe signal STB_BK2 corresponding to the second memory bank 430_2 is enabled. Therefore, the second signal combining unit 514 outputs a signal that is enabled by the second bank strobe signal STB_BK2 and the control signal CTR_2L, so that the first input control signal CTR_STB_12L is enabled. As a result, the first input driving block 470_12L receives the data inputted through the up global input/output line GIO_U, and transmits the received data to the write driving blocks 450_1L and 450_2L respectively corresponding to the first and second memory banks 410_1 and 430_2. At this time, the write driving block 450_2L is activated in response to the write activation signal BWEN_2L, and data outputted from the first input driving block 470_12L are written in the first sub-memory bank 430_2L of the second memory bank 430_2. Likewise, the first input control signal CTR_STB_12L is disabled in response to the second bank strobe signal STB_BK2, and the data transferred through the up global input/output line GIO_U are not inputted to the first input driving block 470_12L anymore.

As can be seen from FIG. 6, enable periods of the first and second input control signals CTR_STB_12L and CTR_STB_12R are defined by enable periods of the first and second bank strobe signals STB_BK1 and STB_BK2.

Meanwhile, the first input driving block 470_12L additionally receives a signal for controlling the data width option (not shown), and thus, it is possible to perform an x16 data width option operation. In the case of performing the x16 data width option operation on the first memory bank 410_1, the control signals CTR_1L and CTR_1R have a logic high level and the first bank strobe signal STB_BK1 is enabled.

Therefore, data transferred through the down global input/output line GIO_D are outputted to the first input driving block 470_12L and transferred to the write driving block 450_1L in response to the first input control signal CTR_STB_12L enabled by the first bank strobe signal STB_BK1 and the signal for controlling the data width option. The data inputted through the up global input/output line GIO_U are outputted to the second input driving block 470_12R and transferred to the write driving block 450_1R in response to the second input control signal CTR_STB_12R enabled by the first bank strobe signal STB_BK1. After all, the data according to the x16 data width option are written in the first memory bank 410_1 by the write driving blocks 450_1L and 450_1R.

As described above, since the semiconductor memory device in accordance with this embodiment includes one input driving block shared by the plurality of banks arranged in the stack structure, it is possible to reduce the number of input driving blocks, the number of control signal lines, and the number of input/output data lines connected to the input driving block. Therefore, it is possible to reduce a chip size of the semiconductor memory device through the structural minimization.

As illustrated in FIG. 4, the data outputted from the first and second input driving blocks 470_12L and 470_12R are transmitted to the corresponding write driving blocks 450_1L, 450_2L, 450_1R, and 450_2R through the common output lines. This means that the number of output lines arranged to cross the memory banks is minimized. Thus, it is possible to reduce the burden when designing the memory banks.

Moreover, since the loading corresponding to just two input driving blocks 470_12L and 470_12R is reflected on the up global input/output line GIO_U, it is possible to perform a more rapid data transmission operation.

In accordance with the embodiments of the present invention, it is possible to minimize an area occupied by the input driver by employing the shared input driver corresponding to the plurality of memory banks. Furthermore, it is possible to obtain an effect capable of reducing the whole chip area of the semiconductor memory device by minimizing the number of control signal lines and input/output data lines connected to the input driver.

While the present invention has been described with respect to the specific embodiments, it will be apparent to those skilled in the art that various changes and modifications may be made without departing from the spirit and scope of the invention as defined in the following claims.

For instance, in the above embodiments, the illustrated logic gates and transistors may be implemented to have different locations and types according to polarities of signals inputted thereto.

What is claimed is:

1. A semiconductor memory device, comprising:
    first and second memory banks each of which includes a plurality of sub-memory banks corresponding to data width option information;
    a plurality of write driving blocks each of which performs a data write operation on each of the sub-memory banks in response to a first or second bank strobe signal;
    a control signal generating block to generate a plurality of input control signals dependent on access information of the first and second memory banks the data width option information; and
    a plurality of common input driving blocks each of which transmits data through a common data line to a write driving block, among the plurality of write driving blocks, for each of the first and second memory banks, wherein the plurality of common input driving blocks are activated in response to the plurality of input control signals.

2. The semiconductor memory device of claim 1, wherein enable periods of the plurality of input control signals are defined by enable periods of the first and second bank strobe signals.

3. The semiconductor memory device of claim 1, wherein the first and second memory banks are stacked with each other.

4. The semiconductor memory device of claim 1, wherein the access information of the first and second memory banks corresponds to the first and second bank strobe signals.

5. The semiconductor memory device of claim 1, wherein the common data lines are disposed to cross one of the first and second memory banks.

6. The semiconductor memory device of claim 1, further comprising an activation signal generating block to generate a plurality of write activation signals for activating a write operation of the write driving blocks in response to the first and second bank strobe signals and the multiplicity of control signals.

7. The semiconductor memory device of claim 1, wherein the number of the plurality of common input driving blocks corresponds to the number of the plurality of sub-memory banks included in one memory bank.

8. A method for operating a semiconductor memory device, the method comprising:
    generating a plurality of bank strobe signals corresponding to a plurality of memory banks in response to write commands, wherein each of the memory banks includes sub-memory banks whose number corresponds to data width option information;
    generating a plurality of input control signals dependent on the plurality of bank strobe signals on a multiplicity of control signals corresponding to the data width option information; and
    receiving data during enable periods of the input control signals and performing a write operation on a corresponding sub-memory bank among the sub-memory banks in response to the bank strobe signals.

9. The method of claim 8, wherein one of the sub-memory banks for each of the plurality of memory banks commonly receives data in response to the input control signals.

10. The method of claim 8, wherein performing the write operation comprises:
    writing data in a first sub-memory bank corresponding to one of the plurality of memory banks in response to the plurality of bank strobe signals; and
    writing second data in a second sub-memory bank corresponding to another one of the plurality of memory banks in response to the plurality of bank strobe signals after writing the data in the first sub-memory bank.

* * * * *